US010036669B1

(12) United States Patent
Lv et al.

(10) Patent No.: US 10,036,669 B1
(45) Date of Patent: Jul. 31, 2018

(54) INFRARED FOCAL PLANE READOUT INTEGRATED CIRCUIT

(71) Applicant: UNIVERSITY OF ELECTRONIC SCIENCE AND TECHNOLOGY OF CHINA, Chengdu, Sichuan (CN)

(72) Inventors: Jian Lv, Sichuan (CN); Longcheng Que, Sichuan (CN); Jinyu Qin, Sichuan (CN); Yue Wan, Sichuan (CN); Qiming Wang, Sichuan (CN); Yadong Jiang, Sichuan (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 15/712,287

(22) Filed: Sep. 22, 2017

(30) Foreign Application Priority Data

Aug. 15, 2017 (CN) .......................... 2017 1 0695763

(51) Int. Cl.
| | |
|---|---|
| *G01J 5/00* | (2006.01) |
| *G01J 5/22* | (2006.01) |
| *H03M 1/12* | (2006.01) |
| *H03K 17/687* | (2006.01) |

(52) U.S. Cl.
CPC .............. *G01J 5/22* (2013.01); *H03K 17/6871* (2013.01); *H03M 1/12* (2013.01)

(58) Field of Classification Search
CPC ........ G01J 5/20; G01J 5/08; G01J 5/02; G01J 5/10; H04N 5/33
See application file for complete search history.

(56) References Cited

U.S. PATENT DOCUMENTS

2015/0192472 A1* 7/2015 Lv .............................. G01J 5/10
250/338.1

* cited by examiner

*Primary Examiner* — David Porta
*Assistant Examiner* — Mamadou Faye
(74) *Attorney, Agent, or Firm* — Ladas & Parry LLP

(57) ABSTRACT

An infrared focal plane readout integrated circuit that includes a unit bias circuit, an integrating circuit, and an on-chip analog-to-digital conversion circuit, where the integrating circuit includes a first switch tube, a second switch tube, and an integrating capacitor; an output end of the unit bias circuit is connected to an input end of the first switch tube; an input end of the second switch tube is connected to a set terminal; both an output end of the first switch tube and an output end of the second switch tube are connected to one end of an integrating capacitor and an input end of the on-chip analog-to-digital conversion circuit; the other end of the integrating capacitor is grounded; and the on-chip analog-to-digital conversion circuit includes a first inverter, a second inverter, a third inverter, an exclusive-OR gate, a built-in sequence counter, and a register.

7 Claims, 1 Drawing Sheet

US 10,036,669 B1

INFRARED FOCAL PLANE READOUT INTEGRATED CIRCUIT

This application claims priority to Chinese application number 201710695763.6, filed Aug. 15, 2017, with a title of INFRARED FOCAL PLANE READOUT INTEGRATED CIRCUIT. The above-mentioned patent application is incorporated herein by reference in its entirety.

TECHNICAL FIELD

The present invention relates to the field of infrared imaging technologies, and in particular, to an infrared focal plane readout integrated circuit.

BACKGROUND

An infrared focal plane array is a core photoelectric device for obtaining an infrared image signal in the infrared imaging technologies, and the infrared focal plane array is composed of an infrared detector and infrared focal plane readout integrated circuits (ROIC: readout integrated circuits). Nowadays, an uncooled infrared focal plane array is one of the arrays that develop most rapidly, but power consumption of the uncooled infrared focal plane array is almost entirely dependent on its readout integrated circuits. Therefore, with the continuous expansion of the infrared focal plane array, a low-powered infrared focal plane readout integrated circuit becomes increasingly important.

At present, the uncooled infrared focal plane array usually uses digital outputs instead of analog outputs due to requirements for high precision and high speed processing. An integrating circuit in an existing infrared focal plane readout integrated circuit usually includes devices such as an operational amplifier, a resistor, and a capacitor, and a comparison circuit is usually provided with an analog comparator. However, the setting of the operational amplifier and the analog comparator not only makes a circuit structure complex, but also leads to rapid increase of power consumption of the infrared focal plane readout integrated circuit when processing large-scale array data.

SUMMARY

On the basis of this, it is necessary to provide an infrared focal plane readout integrated circuit having a simple structure and low power consumption when processing large-scale array data.

To achieve the above purpose, the present invention provides the following solution:

An infrared focal plane readout integrated circuit, including: a unit bias circuit, an integrating circuit, and an on-chip analog-to-digital conversion circuit, where the integrating circuit includes a first switch tube, a second switch tube, and an integrating capacitor; an output end of the unit bias circuit is connected to an input end of the first switch tube; an input end of the second switch tube is connected to a set terminal of the integrating circuit; an output end of the first switch tube and an output end of the second switch tube are separately connected to one end of the integrating capacitor, and the other end of the integrating capacitor is grounded; and an input end of the on-chip analog-to-digital conversion circuit is separately connected to the output end of the first switch tube and the output end of the second switch tube.

Optionally, the on-chip analog-to-digital conversion circuit includes a comparison circuit, a built-in sequence counter, and a register, where an input end of the comparison circuit is connected to an output end of the integrating circuit; the comparison circuit includes two output ends, one output end is connected to a data end of the register, and the other end is connected to an enable end of the register; and an output end of the built-in sequence counter is connected to the data end of the register.

Optionally, the comparison circuit includes a first inverter, a second inverter, a third inverter, and an exclusive-OR gate, where input ends of the first inverter and the second inverter are separately connected to the output end of the integrating circuit; an output end of the first inverter is separately connected to an input end of the third inverter and an input end of the exclusive-OR gate; an output end of the second inverter is connected to another input end of the exclusive-OR gate; an output end of the third inverter is connected to the data end of the register; and an output end of the exclusive-OR gate is connected to the enable end of the register.

Optionally, the unit bias circuit includes a first resistor, a second resistor, a first transistor, and a second transistor, where one end of the first resistor is connected to a first bias signal end, and the other end is connected to a source terminal of the first transistor; a drain terminal of the first transistor is connected to a drain terminal of the second transistor; a source terminal of the second transistor is connected to one end of the second resistor; the other end of the second resistor is grounded; a grid terminal of the first transistor is connected to a second bias signal end; a grid terminal of the second transistor is connected to a third bias signal end; and both the drain terminal of the first transistor and the drain terminal of the second transistor are connected to an input end of the integrating circuit.

Optionally, the built-in sequence counter is an inverted sequence counter.

Optionally, a turnover voltage of the first inverter is greater than a reference voltage of the set terminal, and the reference voltage is greater than a turnover voltage of the second inverter.

Optionally, the register includes multiple D triggers.

Compared with the prior art, the present invention has the following beneficial effects:

The present invention provides an infrared focal plane readout integrated circuit, including: a unit bias circuit, an integrating circuit, and an on-chip analog-to-digital conversion circuit, where the integrating circuit includes a first switch tube, a second switch tube, and an integrating capacitor; the on-chip analog-to-digital conversion circuit includes a comparison circuit, a built-in sequence counter, and a register; and the comparison circuit includes a first inverter, a second inverter, a third inverter, and an exclusive-OR gate. The integrating circuit of the readout integrated circuit is provided with the first switch tube, the second switch tube, and the integrating capacitor, and does not need to be provided with multiple transistors and an operational amplifier, so that a circuit structure is simple, and power consumption of the entire readout integrated circuit can be greatly reduced when large-scale array data is processed. In addition, the comparison circuit is provided with the first inverter, the second inverter, the third inverter, and the exclusive-OR gate, so that the power consumption of the entire readout integrated circuit can further be reduced by using the three inverters instead of an analog comparator.

BRIEF DESCRIPTION OF THE DRAWING

To describe the technical solutions in the embodiments of the present invention or in the prior art more clearly, the following briefly describes the accompanying drawings required for describing the embodiments. Apparently, the accompanying drawings in the following description show some embodiments of the present invention, and a person of ordinary skill in the art may still derive other drawings from these accompanying drawings without creative efforts.

DETAILED DESCRIPTION

The following clearly and completely describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

To make the objectives, features, and advantages of the present invention more apparent, the following further describes the present invention in detail with reference to the accompanying drawings and specific embodiments.

Figure 1:
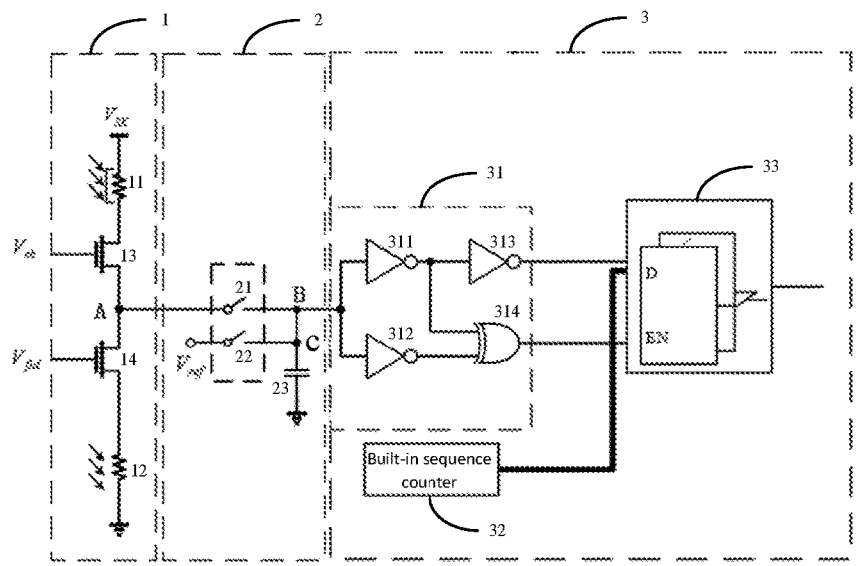
FIG. 1 is a structure diagram of an infrared focal plane readout integrated circuit according to an embodiment of the present invention.

FIG. 1 is a structure diagram of an infrared focal plane readout integrated circuit according to an embodiment of the present invention.

Referring to FIG. 1, the infrared focal plane readout integrated circuit of this embodiment includes a unit bias circuit 1, an integrating circuit 2, and an on-chip analog-to-digital conversion circuit 3, where the unit bias circuit 1 includes a first resistor 11, a second resistor 12, a first transistor 13, and a second transistor 14; one end of the first resistor 11 is connected to a first bias signal end $V_{SK}$, and the other end is connected to a source terminal of the first transistor 13; a drain terminal of the first transistor 13 is connected to a drain terminal of the second transistor 14; a source terminal of the second transistor 14 is connected to one end of the second resistor 12; the other end of the second resistor 12 is grounded; a grid terminal of the first transistor is connected to a second bias signal end $V_{eb}$, a grid terminal of the second transistor is connected to a third bias signal end $V_{fid}$; and both the drain terminal of the first transistor 13 and the drain terminal of the second transistor 14 are connected to an input end of the integrating circuit 2. The first resistor 11 and the second resistor 12 are a photosensitive element; a surface of the first resistor 11 has a light shield layer which cannot absorb incident infrared radiation; and the second resistor 12 can absorb incident infrared radiation, and converts an acquired optical signal into an electrical signal. The integrating circuit 2 includes a first switch tube 21, a second switch tube 22, and an integrating capacitor 23, where an input end of the first switch tube 21 is connected to an output end (A point) of the unit bias circuit 1; an input end of the second switch tube 22 is connected to a set terminal, and a reference voltage of the set terminal is $V_{ref}$; an output end (B point) of the first switch tube 21 and an output end (C point) of the second switch tube 22 are separately connected to one end of the integrating capacitor 23, and the other end of the integrating capacitor 23 is grounded; and an input end of the on-chip analog-to-digital conversion circuit 3 is separately connected to the output end of the first switch tube and the output end of the second switch tube. The on-chip analog-to-digital conversion circuit includes a comparison circuit 31, a built-in sequence counter 32, and a register 33, where an input end of the comparison circuit 31 is connected to an output end of the integrating circuit 2, and the comparison circuit 31 includes two output ends, one output end is connected to a data end D of the register 33, and the other end is connected to an enable end EN of the register 33. The comparison circuit 31 includes a first inverter 311, a second inverter 312, a third inverter 313, and an exclusive-OR gate 314, where input ends of the first inverter 311 and the second inverter 312 are separately connected to the output end of the integrating circuit 2; an output end of the first inverter 311 is separately connected to an input end of the third inverter 313 and an input end of the exclusive-OR gate 314; an output end of the second inverter 312 is connected to another input end of the exclusive-OR gate 314; an output end of the third inverter 313 is connected to the data end D of the register 33; and an output end of the exclusive-OR gate 314 is connected to the enable end EN of the register 33. A turnover voltage $V_H$ of the first inverter 311 is greater than the reference voltage $V_{ref}$ of the set terminal, and the reference voltage $V_{ref}$ is greater than a turnover voltage $V_L$ of the second inverter 312. The built-in sequence counter 32 is an inverted sequence counter. An output of the infrared focal plane readout integrated circuit is positive sequence output by using the inverted sequence counter, ensuring correctness and accuracy of the output. The register 33 includes multiple D triggers, and each D trigger stores a binary code.

A working process of the infrared focal plane readout integrated circuit in this embodiment is as follows:

Each time the infrared focal plane readout integrated circuit operates, the infrared focal plane readout integrated circuit first performs a reset operation, which specifically is: the first switch tube 21 is disconnected, the second switch tube 22 is switched on, and a set voltage of the integrating capacitor 23 is set to the reference voltage $V_{ref}$. The reference voltage $V_{ref}$ is less than the turnover voltage $V_H$ of the first inverter 311, and greater than the turnover voltage $V_L$ of the second inverter 312. A sign bit FB output by the third inverter 313 is 0, and an output of the exclusive-OR gate 314 is "1". The reset operation can improve the accuracy of an output result of the readout integrated circuit.

Then the first switch tube 21 is switched on, the second switch tube 22 is disconnected, and the integrating circuit 2 integrates a current $I_{int}$ output by the unit bias circuit 1, and converts the current $I_{int}$ into an integrated voltage $V_{int}$. The integrated current $I_{int}$ is a difference of a current $I_b$ flowing through the first resistor 11 and a current $I_s$ flowing through the second resistor 12. The comparison circuit 31 compares the integrated voltage $V_{int}$ with the turnover voltage $V_H$ of the first inverter 311 and the turnover voltage $V_L$ of the second inverter 312. There are the following three cases:

When the integrated voltage $V_{int}$ is greater than $V_L$ and lower than $V_H$, the sign bit FB output by the third inverter 313 is unchanged, and is 0, and the output of the exclusive-OR gate 314 is also unchanged, and is "1";

When the integrated voltage $V_{int}$ is greater than $V_H$, the sign bit FB output by the third inverter 313 is changed to 1, and the output of the exclusive-OR gate 314 is changed from "1" to "0". In this case, the register 33 records and outputs a FB value and a count value of the built-in sequence counter 32; and When the integrated voltage $V_{int}$ is lower than $V_L$, the sign bit FB output by the third inverter 313 is unchanged, and is still 0; and the output of the exclusive-OR gate 314 is changed from "1" to "0". In this case, the register 33 records and outputs a FB value and a count value of the built-in sequence counter 32.

Figure 2:
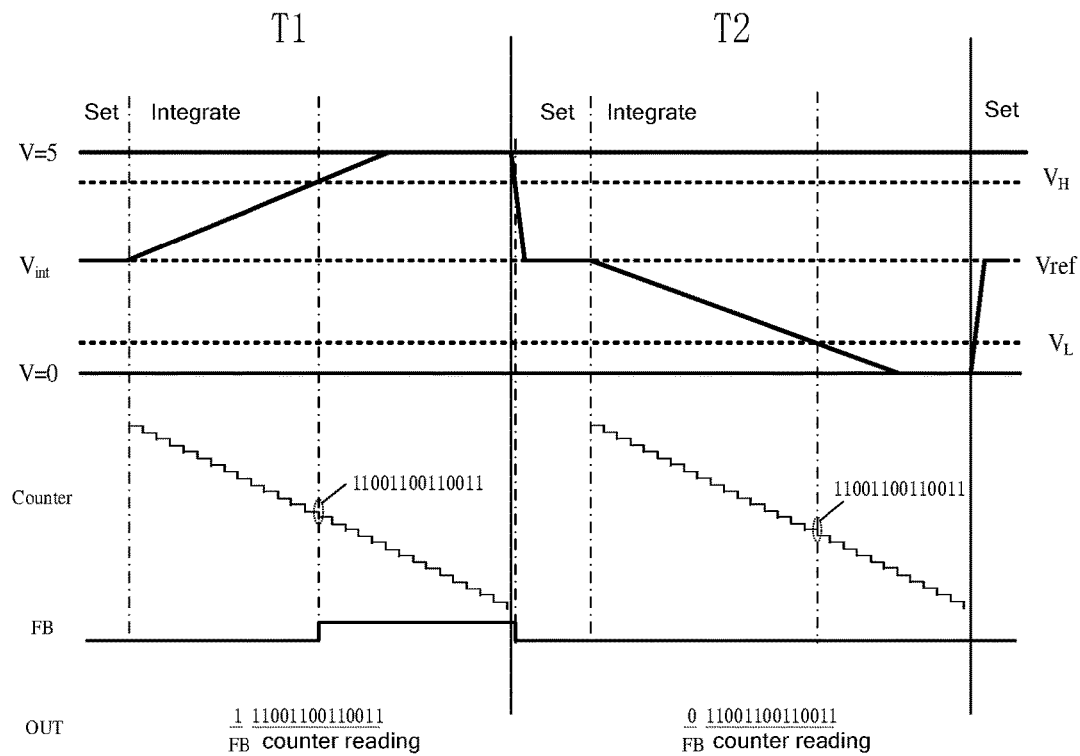
FIG. 2 is a working sequential diagram of an infrared focal plane readout integrated circuit according to an embodiment of the present invention.

FIG. 2 is a working sequential diagram of an infrared focal plane readout integrated circuit according to an embodiment of the present invention.

Referring to FIG. 2, when the infrared focal plane readout integrated circuit operates with a target temperature being T1, the first switch tube 21 in the integrating circuit 2 is disconnected, the second switch tube 22 is switched on, and an integrated voltage $V_{int}$ is set to $V_{ref}$. When it is assumed to that the target temperature is lower than a system temperature, the second resistor 12 is increased, an output current $I_{int}$ of the unit bias circuit 1 is increased, the second switch tube 22 is disconnected, the first switch tube 21 is switched on, and the built-in sequence counter 32 starts to count (Counter), and at the same time, the integrating circuit integrates the current $I_{int}$ to obtain the integrated voltage $V_{int}$. As the output current $I_{int}$ increases, the integrated voltage $V_{int}$ also gradually increases. When the integrated voltage $V_{int}$ is greater than $V_H$, an output of the exclusive-OR gate 314 in the comparison circuit 31 is turned from "1" to "0", and a sign bit FB output by the third inverter 313 is changed from 0 to 1. Assuming that a count result of the built-in sequence counter 32 at this time is 1100110011001, the output of the register 33 is an output of the infrared focal plane readout integrated circuit. Therefore, the output (OUT) of the infrared focal plane readout integrated circuit is 11100110011001.

When the infrared focal plane readout integrated circuit operates with the target temperature being T2, the first switch tube 21 in the integrating circuit 2 is disconnected, the second switch tube 22 is switched on, and the integrated voltage $V_{int}$ is set to $V_{ref}$. When it is assumed to that the target temperature is higher than the system temperature, the second resistor 12 is decreased, the output current $I_{int}$ of the unit bias circuit 1 is decreased, the second switch tube 22 is disconnected, the first switch tube 21 is switched on, and the built-in sequence counter 32 starts to count, and at the same time, the integrating circuit integrates the current $I_{int}$ to obtain the integrated voltage $V_{int}$. As the output current int decreases, the integrated voltage $V_{int}$ also gradually decreases. When the integrated voltage $V_{int}$ is lower than $V_L$, the output of the exclusive-OR gate 314 in the comparison circuit 2 is turned from "1" to "0", and the sign bit FB output by the third inverter 313 is 0. Assuming that a count result of the built-in sequence counter 32 at this time is 1100110011001, the register 33 records and outputs a count of 1100110011001 of the built-in sequence counter 32 and FB=0, and the output of the register 33 is an output of the infrared focal plane readout integrated circuit. Therefore, the output of the infrared focal plane readout integrated circuit is 01100110011001.

The infrared focal plane readout integrated circuit in this embodiment is provided with a first switch tube, a second switch tube, and an integrating capacitor; a comparison circuit is provided with a first inverter, a second inverter, a third inverter, and an exclusive-OR gate; an integrating circuit is used to integrate a current output by a unit bias circuit so as to generate an integrated voltage; the comparison circuit is used to compare the integrated voltage so as to generate a digital output instead of an analog output, so that requirements for high precision and high speed processing can be satisfied. The infrared focal plane readout integrated circuit in this embodiment does not need to be provided with multiple transistors and an operational amplifier, simplifies a circuit structure, and greatly reduces the power consumption of the entire readout integrated circuit while satisfying requirements for high accuracy and high speed processing when large-scale array data is processed. In addition, the power consumption of the entire readout integrated circuit can further be reduced by using three inverters instead of an analog comparator while satisfying requirements for high accuracy and high speed processing when large-scale array data is processed.

Each embodiment of the present specification is described in a progressive manner, each embodiment focuses on the difference from other embodiments, and the same and similar parts between the embodiments may refer to each other.

Several examples are used for illustration of the principles and implementation methods of the present invention. The description of the embodiments is used to help illustrate the method and its core principles of the present invention. In addition, a person skilled in the art can make various modifications in terms of specific embodiments and scope of application in accordance with the teachings of the present invention. In conclusion, the contents of this specification shall not be construed as a limitation to the invention.

What is claimed is:

1. An infrared focal plane readout integrated circuit, comprising:
    a unit bias circuit, an integrating circuit, and an on-chip analog-to-digital conversion circuit, wherein the integrating circuit comprises a first switch tube, a second switch tube, and an integrating capacitor; and
    an output end of the unit bias circuit is connected to an input end of the first switch tube, an input end of the second switch tube is connected to a set terminal of the integrating circuit, an output end of the first switch tube and an output end of the second switch tube are separately connected to one end of the integrating capacitor, the other end of the integrating capacitor is grounded, and an input end of the on-chip analog-to-digital conversion circuit is separately connected to the output end of the first switch tube and the output end of the second switch tube.

2. The infrared focal plane readout integrated circuit according to claim 1, wherein the on-chip analog-to-digital conversion circuit comprises a comparison circuit, a built-in sequence counter, and a register, wherein an input end of the comparison circuit is connected to an output end of the integrating circuit; the comparison circuit comprises two output ends, one output end is connected to a data end of the register, and the other end is connected to an enable end of the register; and an output end of the built-in sequence counter is connected to the data end of the register.

3. The infrared focal plane readout integrated circuit according to claim 2, wherein the comparison circuit comprises a first inverter, a second inverter, a third inverter, and an exclusive-OR gate, wherein input ends of the first inverter and the second inverter are separately connected to the output end of the integrating circuit; an output end of the first inverter is separately connected to an input end of the third inverter and an input end of the exclusive-OR gate; an output end of the second inverter is connected to another input end of the exclusive-OR gate; an output end of the third inverter is connected to the data end of the register; and an output end of the exclusive-OR gate is connected to the enable end of the register.

4. The infrared focal plane readout integrated circuit according to claim 1, wherein the unit bias circuit comprises a first resistor, a second resistor, a first transistor, and a second transistor, wherein one end of the first resistor is connected to a first bias signal end, and the other end is connected to a source terminal of the first transistor; a drain terminal of the first transistor is connected to a drain terminal of the second transistor; a source terminal of the second transistor is connected to one end of the second resistor; the other end of the second resistor is grounded; a grid terminal of the first transistor is connected to a second bias signal end; a grid terminal of the second transistor is connected to a third bias signal end; and both the drain terminal of the first transistor and the drain terminal of the second transistor are connected to an input end of the integrating circuit.

5. The infrared focal plane readout integrated circuit according to claim 2, wherein the built-in sequence counter is an inverted sequence counter.

6. The infrared focal plane readout integrated circuit according to claim 3, wherein a turnover voltage of the first inverter is greater than a reference voltage of the set terminal, and the reference voltage is greater than a turnover voltage of the second inverter.

7. The infrared focal plane readout integrated circuit according to claim 1, wherein the register comprises multiple D triggers.

* * * * *